(12) United States Patent
Droz

(10) Patent No.: US 7,071,422 B2
(45) Date of Patent: Jul. 4, 2006

(54) ELECTRONIC CIRCUIT COMPRISING CONDUCTIVE BRIDGES AND METHOD FOR MAKING SUCH BRIDGES

(75) Inventor: François Droz, La Chaux-de-Fonds (CH)

(73) Assignee: Nagraid S.A., La Chaux-de-Fonds (CH)

( * ) Notice: Subject to any disclaimer, the term of this patent is extended or adjusted under 35 U.S.C. 154(b) by 151 days.

(21) Appl. No.: 10/489,879

(22) PCT Filed: Oct. 1, 2002

(86) PCT No.: PCT/IB02/04039

§ 371 (c)(1),
(2), (4) Date: Mar. 17, 2004

(87) PCT Pub. No.: WO03/030601

PCT Pub. Date: Apr. 10, 2003

(65) Prior Publication Data

US 2004/0238212 A1    Dec. 2, 2004

(30) Foreign Application Priority Data

Oct. 1, 2001 (CH) .................................... 1798/01

(51) Int. Cl.
*H05K 1/11* (2006.01)
*H05K 1/18* (2006.01)
(52) U.S. Cl. .................. 174/261; 174/262; 174/260
(58) Field of Classification Search ........ 174/260–262, 174/254; 361/736, 777, 778, 749, 750, 751; 257/776, E23.064, E23.067
See application file for complete search history.

(56) References Cited

U.S. PATENT DOCUMENTS 2,900,580 A    8/1959  Beck (Continued)

FOREIGN PATENT DOCUMENTS

DE    19916180 A    10/2000

(Continued)

OTHER PUBLICATIONS

Fabrication of Multi-Channel Through Holes Without Copper Plating, IBM Technical Bulletin, IBM Corp., New York, US, vol. 37, No. 2B, Feb. 1, 1994, p. 251-252.

*Primary Examiner*—Randy W. Gibson
*Assistant Examiner*—Hoa C. Nguyen
(74) *Attorney, Agent, or Firm*—Woodard, Emhardt, Moriarty, McNett & Henry LLP

(57) ABSTRACT

The aim of this invention is to obtain a very cheap electronic circuit used for example in a card or a label while maintaining high reliability. It particularly concerns the connection of one or several electronic components on the conductive tracks by means of conductive bridges that traverse the substrate.

The electronic circuit according to the invention includes at least one electronic component (6), a substrate (5), on a first face of this substrate an adhesive layer and a conductive layer including a plurality of tracks (4) are applied. The electronic component (6) comprises at least two connection areas (7). One of these connection areas (7) is electrically linked to the conductive layer by a conductive bridge formed by a conductive segment (1) delimited in the conductive layer only. Said segment (1), free from any adhesive substance, traverses the substrate (5) through a passage (2, 3) and links the connection area (7).

7 Claims, 3 Drawing Sheets

U.S. PATENT DOCUMENTS

| | | |
|---|---|---|
| 3,977,074 A | 8/1976 | Furnival |
| 5,229,548 A * | 7/1993 | Wheeler ..................... 174/262 |
| 5,790,386 A * | 8/1998 | Magee ....................... 361/777 |
| 5,923,539 A * | 7/1999 | Matsui et al. ............... 361/777 |
| 6,535,396 B1 * | 3/2003 | Degenkolb et al. ......... 361/775 |
| 6,707,677 B1 * | 3/2004 | Hsieh et al. ................ 361/748 |
| 6,717,249 B1 * | 4/2004 | Akagawa .................... 257/679 |
| 6,727,436 B1 * | 4/2004 | Barnes et al. ............... 174/255 |

FOREIGN PATENT DOCUMENTS

| | | |
|---|---|---|
| JP | 10092870 A | 4/1998 |
| JP | 2000057289 A | 2/2000 |

* cited by examiner

ELECTRONIC CIRCUIT COMPRISING CONDUCTIVE BRIDGES AND METHOD FOR MAKING SUCH BRIDGES

The present invention concerns an electronic circuit comprising conductive bridges and an embodiment of these bridges. The electronic circuit includes conductive tracks connected to at least one electronic component. The formation of an electric bridge is required to obtain a link on one of the connecting areas of the component.

The invention concerns circuits made by applying several layers, in particular a substrate, an adhesive layer and a conductive layer. This kind of circuit is particularly used in cards with or without external contact or in electronic labels. Electronic label is understood to mean an assembly comprising at least a flexible support, an antenna and an electronic component, generally a chip. The card or electronic label according to the invention is found in many applications as identification, control or payment means.

The object of this invention focuses particularly on electronic circuits comprising an insulating support known as a substrate on which a plurality of conductive tracks or a coil is engraved. These are linked to at least one electronic component such as a chip.

Electronic circuits in which the contacts of an electronic component are directly connected by soldering or conductive gluing to the connecting areas placed under the component are well known to those skilled in the art. According to the circuit configuration comprising conductive tracks or a coil, the connection of a component contact to one of these tracks requires an electric conductive bridge. In particular, this case arises when connecting a coil to a chip. In fact, both ends of the coil are arranged on the inner and outer side of the turns. One of the chip contacts is directly connected to one of the ends of the coil, and the other contact must be connected by means of a conductive bridge to the second end of the coil. This bridge is generally formed by a conductive track passing over the other tracks. In order to avoid short-circuits, the bridge is separated by a portion of insulating film that is glued onto the tracks that it crosses. Another solution consists in traversing the substrate to make the bridge pass to the other face of the substrate under the conductive tracks and to then traverse again the substrate in order to reach a more distant conductive area. This passage is generally made up of a hole drilled in a track, which is sealed by a conductive material assuring the connection to the track. The bridge is soldered on this via on the opposite side to that of the conductive tracks to be crossed.

Document JP2000057289 describes a contactless card including a circuit comprising a coil connected to a chip placed in the inner area of the coil turns. The assembly of the circuit is glued on a flexible substrate. The inner end of the coil is directly connected to the chip, while the outer end traverses the substrate by passing under the coil turns. In this particular case of a flexible thin substrate, a portion of the substrate, on which the outer end of the coil is glued, is cut out. It is then bent by passing under the coil turns before traversing the substrate through an orifice in order to be positioned near the inner end. Thus, the chip can be connected at both ends, which are close to each other, on the same face of the circuit.

Document US2900580 describes a passage formed by a window in a substrate covered by a conductive layer. The window is cut in the substrate only in order to maintain only the conductive layer. The latter is cut on three sides, the last side being folded over the edge of the window to pass on the opposite side. A supplementary insulating layer is glued onto this face and then the window is sealed with resin.

Document JP10092870 describes the passage of a track through a rectangular opening formed in the substrate allowing the conductive of the opposite side layer to appear. The conductive layer is cut on three sides along the edges of this opening and then folded on the fourth side to pass to the upper face.

The known electric bridges described above have the main drawback of requiring delicate and expensive operations. The manufacturing of a large quantity of circuits, cards or labels requires minimal costs and a high execution speed.

The aim of this invention is to avoid the drawbacks described above, namely to obtain an electronic circuit, used for example in a card or a label, at a very low price and maintaining high reliability. In particular, it concerns the connection of one or several electronic components to conductive tracks by means of conductive bridges that traverse the substrate.

Another aim of the invention is also to propose method for making such a conductive bridge.

This aim is reached thanks to an electronic circuit comprising at least one electronic component, a substrate, constituted of a flexible insulating material, on a first face of this substrate an adhesive layer and a conductive layer including a plurality of tracks are applied, said component including at least two connection areas, at least one of these connection areas being electrically linked to the conductive layer by a conductive bridge, characterized in that the substrate includes at least one sensibly rectangular strip made by incisions in the substrate on three sides, the last side being attached to said substrate, and in that the bridge is formed by a conductive segment delimited in the conductive layer only, said segment, free from any adhesive substance, traverses the substrate through one of said strip incisions and links the connection area.

The electronic circuit according to the invention comprises an insulating layer called substrate, an adhesive layer and a conductive layer glued onto the substrate. The conductive layer includes tracks and/or a coil to which an electronic component is connected. The contacts of the component are generally positioned close to each other and they are arranged so that they can be soldered to the connection areas situated under the component and facing the contacts of the latter. In order to connect a track originating from an area situated beyond other tracks, constituting for example the turns of a coil, it is necessary to cross these tracks. This crossing is carried out by means of a bridge that traverses the substrate a first time to pass onto the opposite side under the tracks to be crossed. A second passage through the substrate returns the bridge to the level of the connection area placed under the electronic component.

This bridge is made up of the prolongation of a track originating from the conductive layer. This prolongation that forms a track segment is not glued to the substrate. The end of this bridge is then soldered to the connection area after having traversed the substrate twice.

According to a preferred embodiment of the invention, the passages through the substrate are made up of incisions made in the latter, without it being necessary to remove material, as for example in a drilling. In this embodiment, the substrate is made up of a flexible, thin material. This substrate is used in general for the manufacturing of cards or electronic labels.

In the case of circuits where the substrate passages are carried out by means of drilling or stamping (removal of material from the substrate), the openings are closed again by re-sealing them using a binder after the passage of the bridge. During the finishing operation, for example the lamination of decorative layers, there are still depressions at the level of the passages. To eliminate this drawback, it is necessary to use a larger quantity of binder and a high pressure or a high temperature lamination.

The passages made by means of the incisions in the substrate have the advantage of being able to be closed easily after the bridge passing. In fact, the final lamination of the electronic circuit can be carried out at a reduced pressure and temperature. The manufacturing process is further simplified since re-sealing the passage of the bridge is no longer necessary. The result is thus a circuit with flat faces without deformations due to the substrate traversing. This flatness is increasingly required for thin circuits where the components are embedded in the substrate.

This kind of circuit is frequently used in electronic labels that must be flexible and reliable while also having a very low production cost.

The passage of a track segment through the opening is possible thanks, on the one hand, to the thin tracks coming from the conductive layer and on the other hand to the rounded shape of the opening edges. These rounded edges are achieved by pressure of an incision tool (blade, stamp) used for forming the opening. The flexibility of the substrate is also used to temporary create a passage just sufficient to allow the conductive segment to pass through.

This type of passage is made as many times as necessary to cross the tracks. The length of the bridge depends thus on the number of passages and on the distance to the electronic component connection area. Several tracks can traverse the same incision one beside the other; the length of said incision depends on the width and on the number of tracks passing from one face of the substrate to the other.

A variant of the electronic circuit, according to the invention, includes a conductive layer on each face of the substrate. The conductive passage from one face to the other and/or the track crossing bridge is carried out by means of a passage made by substrate incisions, as described above.

This invention also has as an objective a method for manufacturing an electronic circuit comprising a substrate, constituted by a flexible insulating material, at least one adhesive layer and a conductive layer including a plurality of tracks and an electronic component, characterized in that the execution of a bridge between a zone of the conductive layer and a target connection area, includes the following steps:

prolonging a track in the conductive layer to constitute a conductive segment, cutting in the substrate a sensibly rectangular strip, one of its sides being attached to the substrate, temporarily freeing an opening by pressing the strip, said strip curving along the side attached to the substrate.

passing the conductive segment through said opening, folding the conductive segment against the opposite face of the substrate, closing the opening after the passage of the conductive segment by straightening the strip towards its initial position at the surface level of the substrate.

connecting the conductive segment to the target connection area.

The track originating from the conductive layer that forms the conductive segment is in general a prolongation of a track of the circuit formed in the conductive layer.

The opening in the substrate is formed by incisions made with a blade or by stamping, in order to form a noticeably rectangular strip that has a small side attached to the substrate. The length of the strip is determined by the thickness and the elasticity of the substrate, and the width by this of the conductive segment(s) forming the bridge(s) that must traverse the substrate. This strip is pushed upwards, to free a sufficient opening to allow the segment(s) to pass through. The strip is then released after the passage of the segments so as to close the opening and to preserve the original flatness of the circuit or the card. The segments are then folded against the opposite side of the substrate and these are directed towards an area provided for a second substrate passage, if necessary. A second strip must be cut so that the segment(s) are again situated on the conductive face, this time in the opposite direction. These segments will be then connected to the target connection areas of the electronic component(s). In a final step of the method, the glue of the adhesive layer is thermo-activated in order to adhere the bridge to the substrate.

In the case of the double face variant (conductive layer on both faces of the substrate), only one strip is necessary to make the connection with the other face by means of a track segment originating from the first face.

From the characteristics described above a method for carrying out an electronic circuit substrate traversing by means of a conductive bridge that requires a reduced number of operations, which moreover are relatively inexpensive. All the strips that are necessary can be cut in the substrate during a same step and an adequate tool keeps them curved (open) to allow the passage of the segments. The straightening of the strips into a flat position and the folding of the segments against the faces can be carried out during the laminating operation.

The invention will be better understood thanks to the following detailed description, which refers to the annexed drawings given as non-limitative examples, where:

Figure 4:
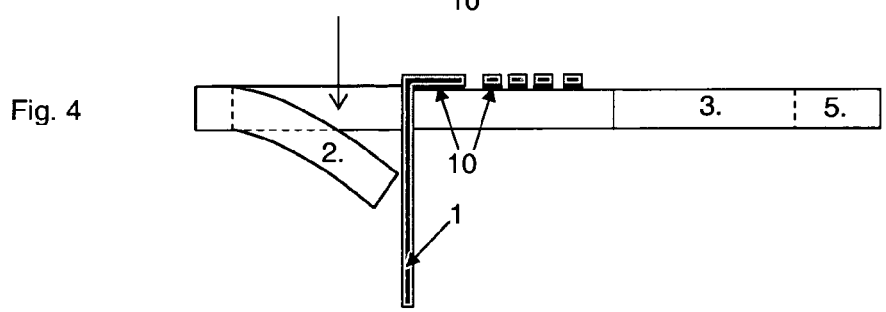
Figure 5:
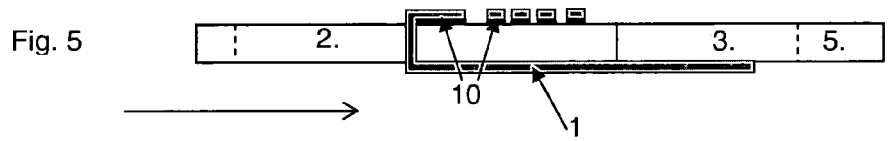
Figure 6:
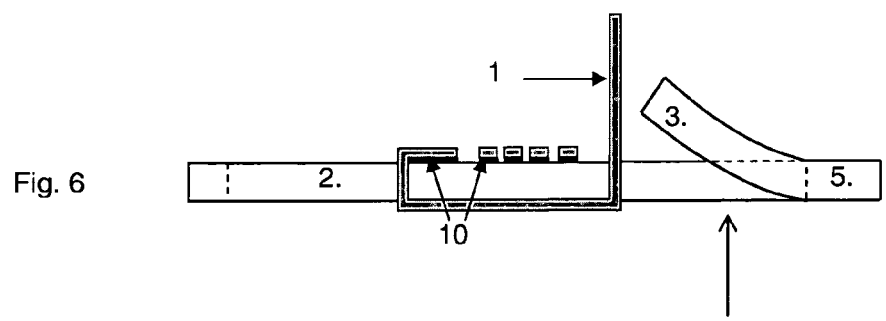
Figure 7:
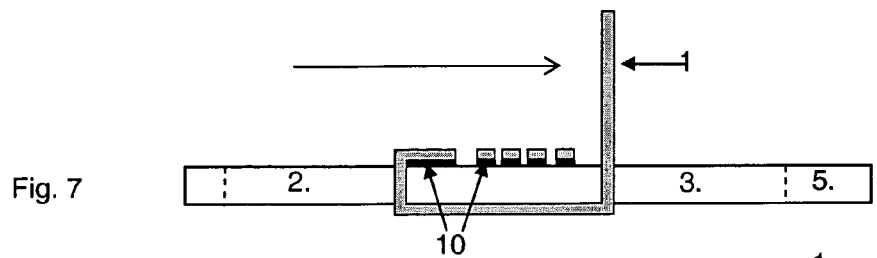
Figure 8:
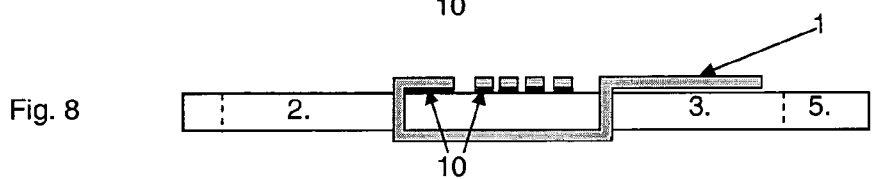
Figure 9:
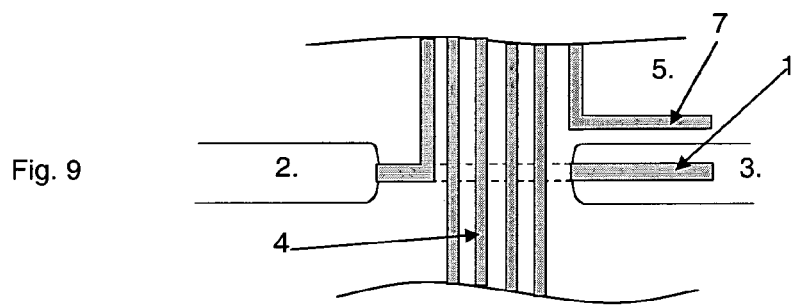
Figure 10:
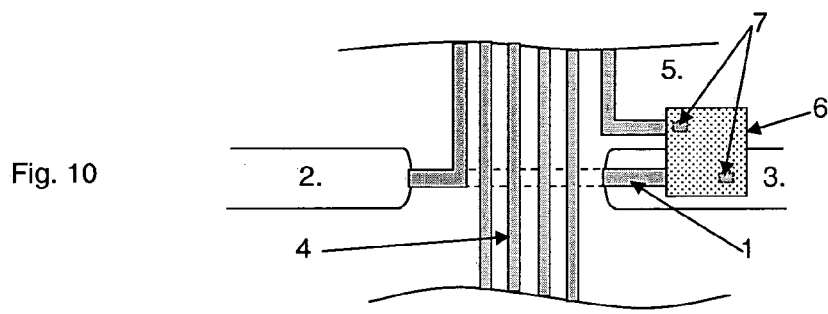
Figure 11:
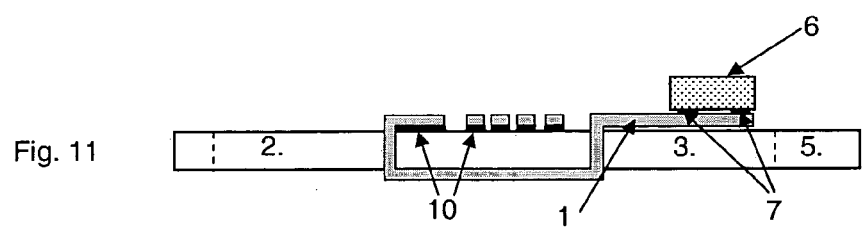

FIG. 4 represents the first strip curved and the track segment passing through the opening FIG. 5 represents the track segment folded against the substrate and the first strip straightened in its initial position FIG. 6 represents the second strip curved and the track segment passing through the opening FIG. 7 represents the second strip straightened FIG. 8 represents the track segment folded against the substrate and the second strip straightened FIG. 9 represents an overview of the final result with the bridge and the two substrate passages FIG. 10 represents an overview of a portion of a circuit with a component positioned and soldered on the tracks FIG. 11 represents a cross-section of the portion of the circuit shown in FIG. 10

Figure 12:
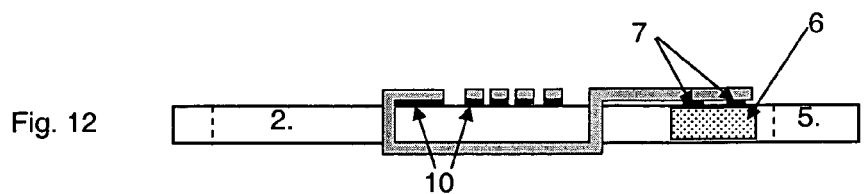

FIG. 12 represents a cross-section according to FIG. 11 but with a component housed inside the substrate and soldered under the tracks.

Figure 13:
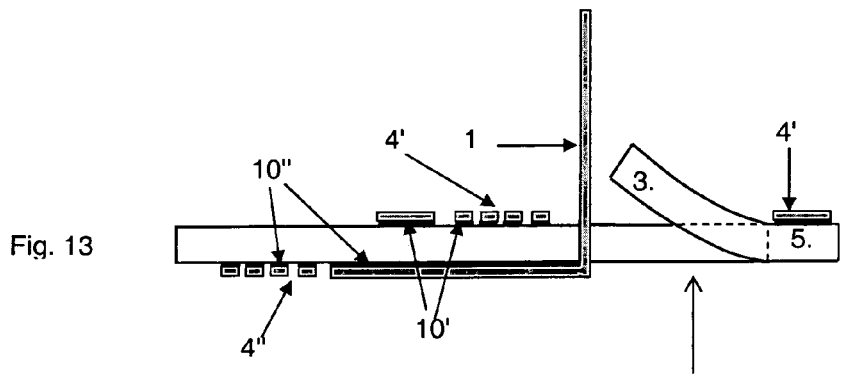

FIG. 13 represents cross-section of a portion of a circuit with conductive layer on both faces of the substrate with a track segment passing from the bottom face to the top face through a curved strip.

Figure 14:
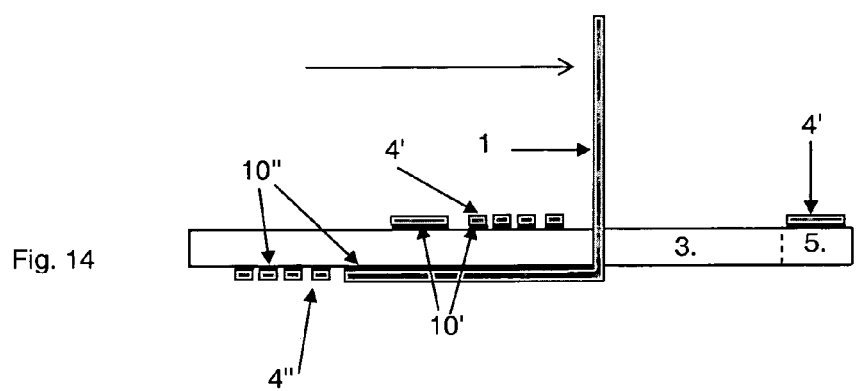

FIG. 14 represents the cross-section of FIG. 13 with the strip straightened in its initial position.

Figure 15:
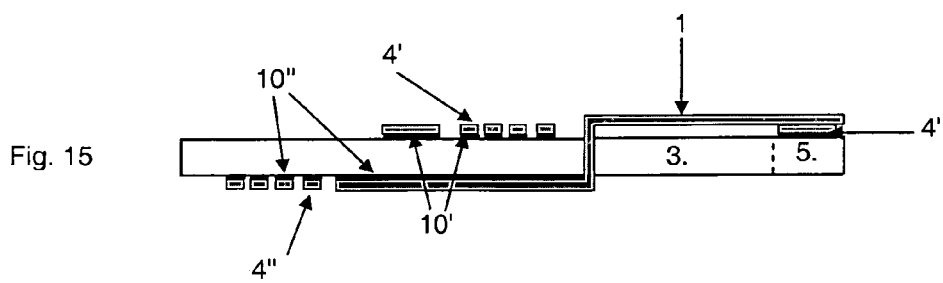

FIG. 15 represents the cross-section of FIG. 14 with the track segment folded against the substrate and connected to a track of the top face.

Figure 16:
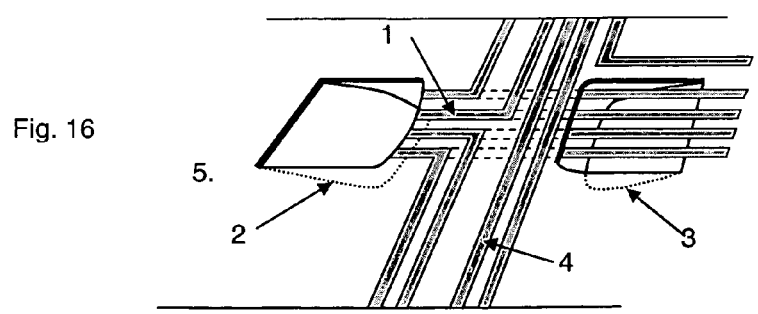

FIG. 16 represents a perspective view of a portion of a circuit with several bridges passing under tracks through a same strip.

Figure 1:
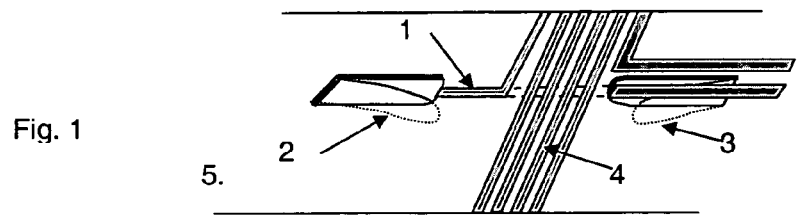
FIG. 1 represents a perspective view of a portion of a circuit with a bridge passing under the tracks

FIG. 1 shows in a perspective view a conductive bridge (1) traversing a substrate (5) through a first slot and passing under the tracks (4) and that traverses the substrate (5) again through a second slot. The slots are made up an incision formed during the cutting of the strips (2) and (3). The latter are illustrated lifted in order to better distinguish the passage of the track through the substrate (5). The bridge is formed by means of the prolongation of a track or by track segment (1) that is not glued to the substrate (5). According to a step, not illustrated, the adhesive layer (10) is selectively deposited on the substrate so that the area or the conductive track that will form the conductive segment is free of glue.

FIGS. 2 to 9 illustrate the different steps for the production of the bridge represented in FIG. 1. FIGS. 10 to 12 show the connection of an electronic component after the production of the bridge.

Figure 2:
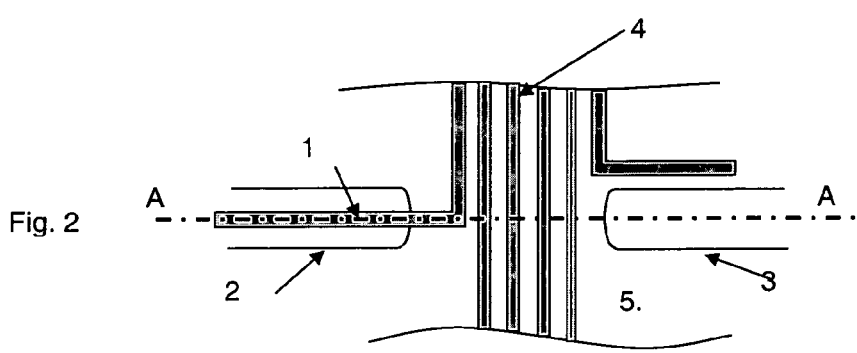
FIG. 2 represents an overview of a portion of a circuit with two strips previously cut and a track segment before substrate traversing.

FIG. 2 illustrates both previously cut rectangular strips (2) and (3), one of the short sides of the strips remaining attached to the substrate. These cuts are made at each side of the tracks (4) that must be crossed by the track segment (1).

Figure 3:
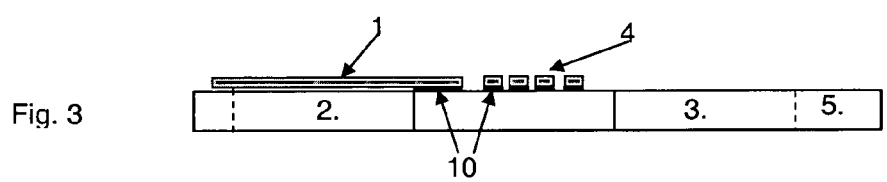
FIG. 3 represents a cross section of a portion of the circuit shown in FIG. 2

FIG. 3 is a cross-section view according to axis A—A of FIG. 2 that illustrates the first step of the execution of the bridge formed by the track segment (1). The segment (1) covers the first strip (2) without adhering to it.

FIG. 4 shows the first strip (2) cut previously, curved downwards so as to free a sufficient opening to allow the track segment (1) passing through. The latter is first folded over the edge of the opening formed by the strip; the segment (1) is then directed downwards through the opening.

FIG. 5 shows the first strip (2) straightened again to the same level as the substrate (5), that is to say in the same position as before the passage of the track segment (1). The latter is folded against the opposite side of the substrate (5) and directed towards the second previously cut strip (3) by passing under the tracks (4).

FIG. 6 shows the second passage of the track segment (1) through the opening made by the second strip (3). This time said strip (3) is curved upwards to allow the segment (1) to pass through the substrate (5). The track segment (1) is then folded over the edge of the opening as in the first passage through the substrate (5).

FIG. 7 shows the second strip straightened back to its initial position with the track segment (1) that traverses the substrate (5).

FIGS. 8 and 9 illustrate the final position of the track segment (1) that is folded against the face of the substrate (5) close to the other tracks. A part of the track segment (1) becomes a connection area (7) for the electronic component (6). The first contact is soldered onto the track segment (1) and the other is soldered to the track already beside it, as illustrated in FIGS. 10 and 11.

FIG. 12 shows another way of connecting the component (6) to the conductive tracks. The component is housed in a window cut in the substrate in such a way as to expose its contacts facing the tracks passing inside the window. This particular assembly allows the component to be embedded in the substrate in order to obtain a label with minimal thickness.

According to another embodiment of the invention, instead of using stamped strips in the substrate, the passage of a bridge from one side of the substrate to the other is made by a hole formed by removing of material, namely by drilling or stamping. In the same way as for the version with a strip, the bridge is formed by a conductive segment that prolongs a track originating from the conductive layer. This segment, that is free from adhesive substance (10), traverses said substrate through the hole to carry out the connection on the other face. FIGS. 13 to 15 show an example with a passage, from the bottom face to the top face of a substrate, made with a strip.

This method allows manufacturing very inexpensive single-face circuits while keeping the possibility to dispose one or several tracks crossing over other tracks as in the example shown on FIG. 16.

If a microchip card is desired, for example, the orifices will be re-sealed with a filler substance such as epoxy resin for example. A final lamination assures the flatness of the circuit.

The invention claimed is:

1. Electronic circuit comprising at least one electronic component (6), a substrate (5), constituted by a flexible insulating material, on a first face of this substrate (5) an adhesive layer and a conductive layer including a plurality of tracks (4) are applied, said component (6) including at least two connection areas (7), at least one of these connection areas (7) being electrically linked to the conductive layer by a conductive bridge, characterized in that the substrate includes at least one sensibly rectangular strip (2, 3) made by incisions in the substrate (5) on three sides, the last side being attached to said substrate (5), and in that the bridge is formed by a conductive segment (1) delimited in the conductive layer only, said segment (1), free from any adhesive substance, traverses the substrate (5) through one of said strip (2, 3) incisions of and links the connection area (7).

2. Electronic circuit according to claim 1, characterized in that the substrate (5) includes a second face with a second adhesive layer and a second conductive layer, and in that said bridge is formed by a conductive segment (1) delimited in the second conductive layer only, said segment (1), free from any adhesive substance, traverses the substrate (5) by one of said strip (2, 3) incisions and links the connection area (7) and/or the first conductive layer.

3. Electronic circuit according to claims 1 or 2, characterized in that a plurality of bridges formed by track segments (1) traverse the substrate (5) through a same incision.

4. Electronic circuit according to claim 1, characterized in that at least one bridge formed by a track segments (1) traverses the substrate (5) as many times as it is necessary to cross tracks (4) belonging to the conductive layer in order to reach the connection area (7).

5. Chip card or electronic label characterized in that it includes an electronic circuit according to claim 1.

6. Method for manufacturing an electronic circuit comprising a substrate (5), constituted by a flexible insulating material, at least one adhesive layer and a conductive layer including a plurality of tracks (4) and an electronic component (6), characterized in that the execution of a bridge between a zone of the conductive layer and a target connection area (7), includes the following steps:

prolonging a track in the conductive layer to constitute a conductive segment (1), cutting in the substrate (5) a sensibly rectangular strip (2, 3), one of its sides being attached to the substrate (5), temporarily freeing an opening by pressing the strip (2, 3), said strip (2, 3) curving along the side attached to the substrate (5), passing the conductive segment (1) through said opening, folding the conductive segment (1) against the opposite face of the substrate (5), closing the opening after the passage of the conductive segment (1) by straightening the strip (2, 3) towards its initial position at the surface level of the substrate (5), connecting the conductive segment (1) to the target connection area (7).

7. Method according to claim 6, characterized in that the target connection area is placed on the conductive layer, and in that the conductive segment (1) returns to said conductive layer by a second substrate passage by means of a supplementary strip (2, 3), said conductive segment (1) then being fixed to the substrate (5) by activating the glue originating from the adhesive layer.

* * * * *